United States Patent
Song et al.

(10) Patent No.: US 11,758,703 B2
(45) Date of Patent: Sep. 12, 2023

(54) DISPLAY MODULE AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Changjian Song, Wuhan (CN); Siping Wu, Wuhan (CN); Weiwei Li, Wuhan (CN); Shengfang Liu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 314 days.

(21) Appl. No.: 17/263,111

(22) PCT Filed: Aug. 5, 2020

(86) PCT No.: PCT/CN2020/107137
§ 371 (c)(1),
(2) Date: Jan. 25, 2021

(87) PCT Pub. No.: WO2022/016619
PCT Pub. Date: Jan. 27, 2022

(65) Prior Publication Data
US 2022/0304199 A1    Sep. 22, 2022

(30) Foreign Application Priority Data

Jul. 21, 2020 (CN) .......................... 202010706622.1

(51) Int. Cl.
*G06F 1/16* (2006.01)
*H05K 5/00* (2006.01)
(Continued)

(52) U.S. Cl.
CPC ................ *H05K 7/20981* (2013.01)

(58) Field of Classification Search
CPC ................ H05K 7/20981; H05K 7/20954
See application file for complete search history.

(56) References Cited

U.S. PATENT DOCUMENTS

| 9,456,525 | B2* | 9/2016 | Yoon | H05K 7/20972 |
| 10,485,147 | B2* | 11/2019 | Oh | H05K 7/2099 |
| 2005/0062383 | A1* | 3/2005 | Bae | H05K 7/20963 |
| | | | | 313/46 |

FOREIGN PATENT DOCUMENTS

| CN | 200965439 Y | 10/2007 |
| CN | 205800807 U | 12/2016 |

(Continued)

OTHER PUBLICATIONS

International Search Report in International application No. PCT/CN2020/107137, dated Apr. 22, 2021.
(Continued)

*Primary Examiner* — Anthony M Haughton
(74) *Attorney, Agent, or Firm* — PV IP PC; Wei Te Chung; Zhigang Ma

(57) ABSTRACT

A display module and a display device, the display module includes a display panel including a substrate, a driving circuit layer, and a display function layer; a heat dissipation layer is arranged on a side of the substrate away from the driving circuit layer and configured to dissipate heat of the display panel, a material of the heat dissipation layer comprises a thermally conductive metal material; the heat dissipation layer comprises a plurality of heat dissipation channels regularly arranged, and each of the heat dissipation channels is configured to pass a heat dissipation medium, thereby alleviating a problem of heat concentration in current vehicle-mounted display devices.

15 Claims, 3 Drawing Sheets

(51) Int. Cl.
*H05K 7/00* (2006.01)
*H05K 7/20* (2006.01)

(56) References Cited

FOREIGN PATENT DOCUMENTS

| | | | |
|---|---|---|---|
| CN | 107624027 | A | 1/2018 |
| CN | 108196397 | A | 6/2018 |
| CN | 109637363 | A | 4/2019 |
| CN | 110060576 | A | 7/2019 |
| CN | 110494014 | A | 11/2019 |
| CN | 110675760 | A | 1/2020 |
| CN | 111295082 | A | 6/2020 |
| KR | 20060102434 | A | 9/2006 |
| KR | 20100122685 | A | 11/2010 |

OTHER PUBLICATIONS

Written Opinion of the International Searching Authority in International application No. PCT/CN2020/107137, dated Apr. 22, 2021.

\* cited by examiner

DISPLAY MODULE AND DISPLAY DEVICE

RELATED APPLICATIONS

This application is a Notional Phase of PCT Patent Application No. PCT/CN2020/107137 having international filing date of Aug. 5, 2020, which claims the benefit of priority of Chinese Patent Application No. 202010706622.1 filed on Jul. 21, 2020. The contents of the above applications are all incorporated by reference as if fully set forth herein in their entirety.

FIELD OF INVENTION

The present disclosure relates to the field of display technology, and more particularly to a display module and a display device.

BACKGROUND OF INVENTION

As a degree of integration of electronic components becomes higher and higher, a heat flux density in a component area of electronic products is also increasing. For vehicle-mounted display devices, a display panel must not only withstand heat generated by a screen itself, but also withstand heat of high-temperature environment in the vehicle during summer. If the heat is not dissipated in time, operation and normal use of the display panel will be affected due to excessively high local temperature.

Therefore, current vehicle-mounted display devices have a problem of heat concentration, which needs to be solved.

SUMMARY OF INVENTION

The present disclosure provides a display module and a display device to alleviate the problem of heat concentration in current vehicle-mounted display devices.

The present disclosure provides a display module, including: a display panel includes a substrate, a driving circuit layer, and a display function layer;

a heat dissipation layer arranged on a side of the substrate away from the driving circuit layer and configured to dissipate heat of the display panel, a material of the heat dissipation layer includes a thermally conductive metal material; the heat dissipation layer includes a plurality of heat dissipation channels, and each of the heat dissipation channels is configured to allow a heat dissipation medium to pass.

In one embodiment of the display module provided by the present disclosure, the heat dissipation layer includes a plurality of heat dissipation pipelines, each of the heat dissipation pipelines includes a hollow structure passing through both ends of the heat dissipation pipeline, and the hollow structure forms each of the heat dissipation channels.

In one embodiment of the display module provided by the present disclosure, the plurality of heat dissipation pipelines comprise a plurality of first heat dissipation pipelines extending in a first direction and a plurality of second heat dissipation pipelines extending in a second direction, the first direction and the second direction are perpendicular to each other, and the plurality of first heat dissipation pipelines and the plurality of second heat dissipation pipelines are interlaced.

In one embodiment of the display module provided by the present disclosure, the plurality of heat dissipation pipelines extend along a first direction and are arranged in a row along a second direction, and the first direction and the second direction are perpendicular to each other.

In one embodiment of the display module provided by the present disclosure, the heat dissipation layer includes a first heat dissipation plate, a second heat dissipation plate, and a plurality of spacer plates, the first heat dissipation plate and the second heat dissipation plate are arranged opposite to each other in parallel, the plurality of spacer plates are arranged between the first heat dissipation plate and the second heat dissipation plate, and are connected to the first heat dissipation plate and the second heat dissipation plate respectively; at least two of central axes of the spacer plates are parallel to each other and parallel to the first heat dissipation plate, and the first heat dissipation plate and/or the second heat dissipation plate and the adjacent two of the spacer plates jointly enclose the heat dissipation channel.

In one embodiment of the display module provided by the present disclosure, at least one of the spacer plates is vertically connected to the first heat dissipation plate and the second heat dissipation plate.

In one embodiment of the display module provided by the present disclosure, at least one of the spacer plates is arranged at an acute angle with the first heat dissipation plate and the second heat dissipation plate.

In one embodiment of the display module provided by the present disclosure, the first heat dissipation plate, the second heat dissipation plate, and the spacer plate are integrally arranged.

In one embodiment of the display module provided by the present disclosure, an outer diameter of the heat dissipation channel is less than or equal to 2 cm, and a thickness of the heat dissipation channel is less than 1 cm.

In one embodiment of the display module provided by the present disclosure, thicknesses of the first heat dissipation plate, the second heat dissipation plate and the spacer plate are all less than 1 cm, and a thickness of the heat dissipation layer is less than or equal to 2 cm.

Meanwhile, the present disclosure provides a display device, including:

the display module provided by embodiments of the present disclosure, the display module includes a display panel includes a substrate, a driving circuit layer, and a display function layer; a heat dissipation layer arranged on a side of the substrate away from the driving circuit layer and configured to dissipate heat of the display panel, a material of the heat dissipation layer includes a thermally conductive metal material; the heat dissipation layer includes a plurality of heat dissipation channels, and each of the heat dissipation channels is configured to allow a heat dissipation medium to pass;

a cooling machine includes a heat dissipation medium inlet and a heat dissipation medium outlet, the heat dissipation medium outlet is connected to an inlet end of the heat dissipation channel, and the heat dissipation medium inlet is connected to an outlet end of the heat dissipation channel; the cooling machine is configured to cool the heat dissipation medium transferred from the outlet end of the heat dissipation channel, and input the heat dissipation medium after the cooling process to the plurality of heat dissipation channels.

In the display device provided in the present disclosure, the heat dissipation medium includes a gas heat dissipation medium and a liquid heat dissipation medium.

In the display device provided by the present disclosure, the heat dissipation layer includes a plurality of heat dissipation pipelines, each of the heat dissipation pipelines includes a hollow structure passing through both ends of the heat dissipation pipeline, and the hollow structure forms each of the heat dissipation channels.

In the display device provided by the present disclosure, the plurality of heat dissipation pipelines comprise a plurality of first heat dissipation pipelines extending in a first direction and a plurality of second heat dissipation pipelines extending in a second direction, the first direction and the second direction are perpendicular to each other, and the plurality of first heat dissipation pipelines and the plurality of second heat dissipation pipelines are interlaced.

In the display device provided by the present disclosure, the plurality of heat dissipation pipelines extend along a first direction and are arranged in a row along a second direction, and the first direction and the second direction are perpendicular to each other.

In the display device provided by the present disclosure, the heat dissipation layer includes a first heat dissipation plate, a second heat dissipation plate, and a plurality of spacer plates, the first heat dissipation plate and the second heat dissipation plate are arranged opposite to each other in parallel, the plurality of spacer plates are arranged between the first heat dissipation plate and the second heat dissipation plate, and are connected to the first heat dissipation plate and the second heat dissipation plate respectively; at least two of central axes of the spacer plates are parallel to each other and parallel to the first heat dissipation plate, and the first heat dissipation plate and/or the second heat dissipation plate and the adjacent two of the spacer plates jointly enclose the heat dissipation channel.

In the display device provided by the present disclosure, at least one of the spacer plates is vertically connected to the first heat dissipation plate and the second heat dissipation plate.

In the display device provided by the present disclosure, at least one of the spacer plates is arranged at an acute angle with the first heat dissipation plate and the second heat dissipation plate.

In the display device provided by the present disclosure, an outer diameter of the heat dissipation channel is less than or equal to 2 cm, and a thickness of the heat dissipation channel is less than 1 cm.

In the display device provided by the present disclosure, thicknesses of the first heat dissipation plate, the second heat dissipation plate and the spacer plate are all less than 1 cm, and a thickness of the heat dissipation layer is less than or equal to 2 cm.

The present disclosure provides a display module and a display device. The display module includes a display panel including a substrate, a driving circuit layer, and a display function layer; a heat dissipation layer arranged on a side of the substrate away from the driving circuit layer and configured to dissipate heat of the display panel, a material of the heat dissipation layer includes a thermally conductive metal material; the heat dissipation layer includes a plurality of heat dissipation channels, and each of the heat dissipation channels is configured to allow a heat dissipation medium to pass. The heat dissipation channel in the heat dissipation layer provides a circulation channel for the heat dissipation medium, allowing the heat dissipation medium to circulate on the substrate side of the display panel to perform heat dissipation treatment to the display panel, thereby removing the heat of the display panel, and reducing the temperature of the display panel. It is conducive to the normal operation and use of the display panel, and alleviates the problem of heat concentration in the current vehicle-mounted display device.

DESCRIPTION OF FIGURES

The following describes the specific implementations of the present disclosure in detail with reference to the accompanying figures, which will make the technical solutions and other beneficial effects of the present disclosure obvious.

DETAILED DESCRIPTION OF PREFERRED EMBODIMENTS

In view of the heat concentration problem of the current vehicle-mounted display device, the present disclosure provides a display module to alleviate this problem.

Figure 1:
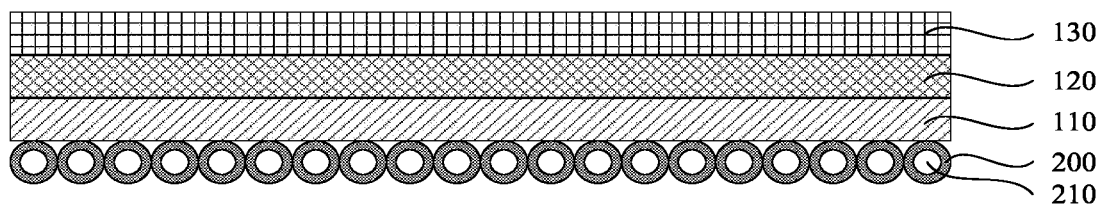
FIG. 1 is a schematic structural diagram of a display module provided by one embodiment of the present disclosure.

In one embodiment, please refer to FIG. 1. FIG. 1 shows a schematic structural diagram of a display module provided. In one embodiment of the present disclosure, as shown in the figure, the display module provided by the embodiment of the present disclosure includes:

A display panel 100 including a substrate 110, a driving circuit layer 120, and a display function layer 130.

A heat dissipation layer 200 is arranged on a side of the substrate 110 away from the driving circuit layer 120 and configured to dissipate heat of the display panel 100. A material of the heat dissipation layer 200 includes a thermally conductive metal material; the heat dissipation layer 200 includes a plurality of heat dissipation channels 210 arranged regularly, and each of the heat dissipation channels 210 is configured to allow a heat dissipation medium to pass.

The embodiment of the present disclosure provides a display module. The display module is provided with a heat dissipation layer on the side of the substrate away from the driving circuit layer. The heat dissipation layer includes a plurality of heat dissipation channels regularly arranged, and the heat dissipation channels are configured to allow a heat dissipation medium to pass. Each of the heat dissipation channels provides a circulation channel to the heat dissipation medium. By circulating the heat dissipation medium on the substrate side of the display panel to dissipate the display panel, removing the heat of the display panel, and reducing the temperature of the display panel, the normal operation and use of the display panel is facilitated, thereby alleviating the problem of heat concentration in the current vehicle-mounted display device.

Figure 2:
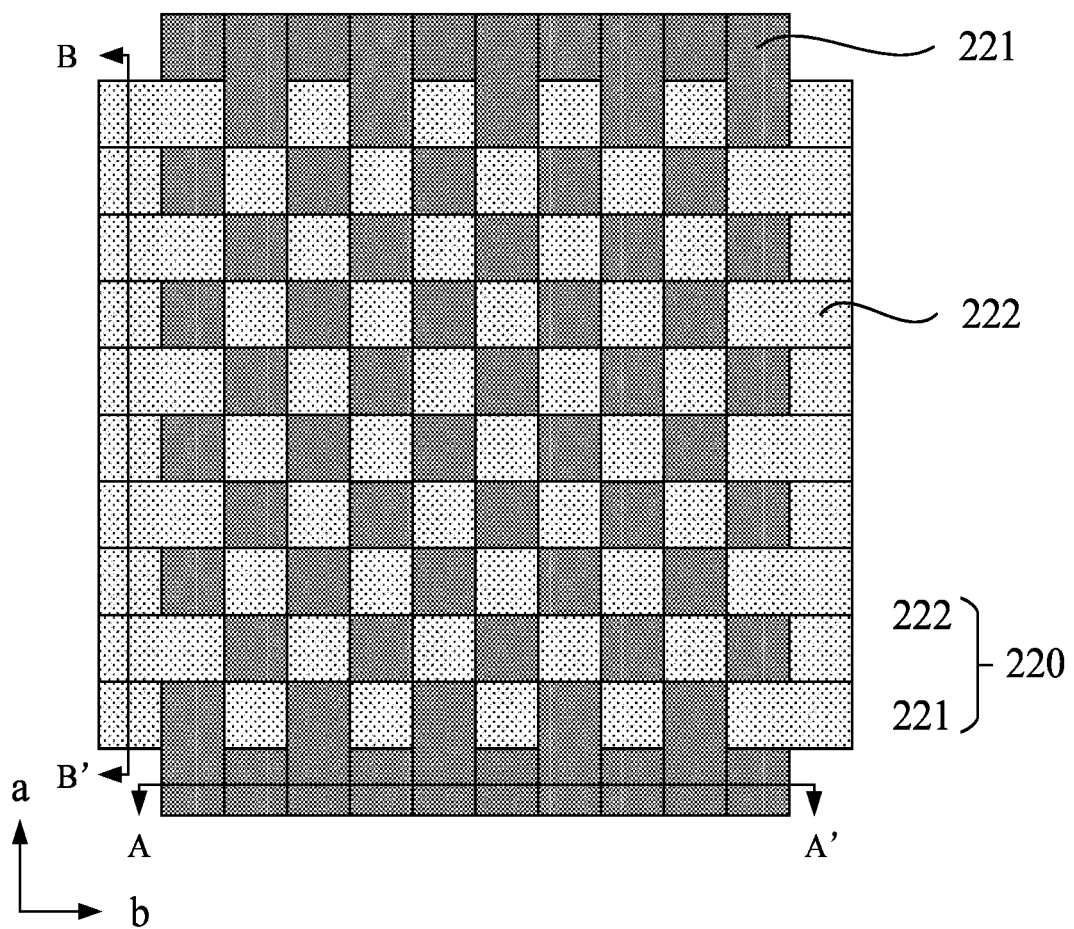
FIG. 2 is a schematic diagram of a first structure of a heat dissipation layer provided by one embodiment of the present disclosure.

In the first embodiment, please refer to FIG. 2. FIG. 2 shows a schematic diagram of a first structure of the heat dissipation layer provided by one embodiment of the present disclosure. As shown in the figure, the heat dissipation layer 200 includes a plurality of heat dissipation pipelines 220. The plurality of the heat dissipation pipelines 220 include a plurality of first heat dissipation pipelines 221 extending along a first direction a and a plurality of second heat dissipation pipelines 222 extending along a second direction b. The first direction a and the second direction b are perpendicular to each other. Each of the first heat dissipation pipelines 221 includes a hollow structure penetrating the first heat dissipation pipeline 221 in the first direction a, and the hollow structure forms a first heat dissipation channel 211. Each of the second heat dissipation pipelines 222 includes a hollow structure penetrating the second heat dissipation pipeline 222 in the second direction b, and the hollow structure forms the second heat dissipation channel 212.

A material of the first heat dissipation pipeline 221 and the second heat dissipation pipeline 222 includes a metal material with good heat conduction effect, such as metal copper, metal aluminum, and the like. It is configured to transfer the heat in the display panel and the heat dissipation medium to realize heat exchange.

The plurality of first heat dissipation pipelines 221 and the plurality of second heat dissipation pipelines 222 are interlaced to form a network-shaped heat dissipation layer. From the figure, the plurality of first heat dissipation pipelines 221 in the odd row from top to bottom are located above the plurality of second heat dissipation pipelines 222 in the odd row from left to right, and at the same time located under the second heat dissipation pipelines 222 in the even row from left to right. The plurality of first heat dissipation pipelines 221 in the even row from top to bottom are located under the second heat dissipation pipelines 222 in the odd row from left to right, and is located on the plurality of second heat dissipation pipelines 222 in the even row from left to right.

Figure 4:
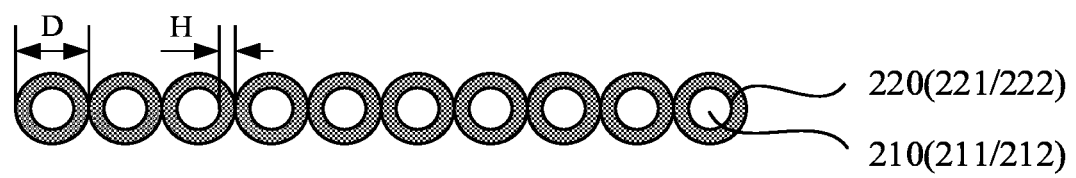
FIG. 4 is a schematic diagram of a third structure of the heat dissipation layer provided by one embodiment of the present disclosure.

In one embodiment, please refer to FIG. 4. FIG. 4 shows a schematic diagram of a third structure of the heat dissipation layer provided by one embodiment of the present disclosure, which is specifically a cross-sectional view in an AA' direction or a BB' direction in FIG. 2. As shown in the figure, the cross-sectional shape of each of the first heat dissipation pipelines 221 or/and each of the second heat dissipation pipelines 222 is a hollow ring, that is, a shape of a cross section of the first heat dissipation pipeline 221 or/and the second heat dissipation pipeline 222 is a hollow cylinder, and the hollow structure is also a cylinder. In one embodiment, it may also be that the shape of the first heat dissipation pipeline 221 or/and the second heat dissipation pipeline 222 is a hollow cylinder, and the hollow structure is a polygonal prism. The cross-sectional shape of the corresponding first heat dissipation pipeline 221 or/and the second heat dissipation pipeline 222 is a polygonal hollow structure with a circular ring shape on the periphery. In one embodiment, the outer shape of the first heat dissipation pipeline 221 or/and the second heat dissipation pipeline 222 is cylindrical, and the cylindrical peripheral arc structure can provide a good sliding effect in an interlaced braided arrangement, and prevent friction between the first heat dissipation pipeline 221 and the second heat dissipation pipeline 222 from causing the problem of damage to the first heat dissipation pipeline 221 and the second heat dissipation pipeline 222.

In one embodiment, as shown in FIGS. 2 and 4, the adjacent first heat dissipation pipelines 221 are arranged in contact, and the adjacent second heat dissipation pipelines 222 are arranged in contact, so that the display modules in the same area can be provided with more heat dissipation channels and more circulation space for the heat dissipation medium, and more heat dissipation medium will circulate on the substrate side of the display panel, which is more conducive to the heat dissipation of the display panel. It may also be that the adjacent first heat dissipation pipelines 221 and/or the adjacent second heat dissipation pipelines 222 are arranged at intervals, that is, the adjacent first heat dissipation pipelines 221 are not in contact, and/or the adjacent second heat dissipation pipelines 222 are not in contact.

Further, the cross-sectional shape of the first heat dissipation pipeline 221 is the same as the cross-sectional shape of the second heat dissipation pipeline 222, and the cross-sectional size of the first heat dissipation pipeline 221 is also the same as the cross-sectional size of the second heat dissipation pipeline 222. In this way, the plurality of first heat dissipation pipelines 221 and the plurality of second heat dissipation pipelines 222 with the same shape and size are interlaced, the surface of the heat dissipation layer 200 formed will be flatter, and the internal structure will be more uniform and stable.

Outer diameters D of the first heat dissipation pipeline 221 and the second heat dissipation pipeline 222 are less than or equal to 2 cm, and thicknesses H of the first heat dissipation pipeline 221 and the second heat dissipation pipeline 222 are less than 1 cm.

Figure 5:
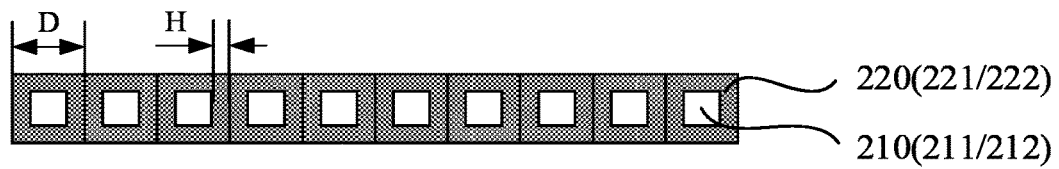
FIG. 5 is a schematic diagram of a fourth structure of the heat dissipation layer provided by one embodiment of the present disclosure.

In another embodiment, please refer to FIG. 5. FIG. 5 shows a schematic diagram of a fourth structure of the heat dissipation layer provided by one embodiment of the present disclosure, specifically a cross-sectional view in the AA' direction or the BB' direction in FIG. 2. As shown in the figure, a cross-sectional shape of the first heat dissipation pipeline 221 or/and the second heat dissipation pipeline 222 is a hollow square ring, that is, a shape of the cross section of the first heat dissipation channel 221 or/and the second heat dissipation pipeline 222 is a hollow quadrangular prism, and the hollow structure is also a quadrangular prism. In one embodiment, it is also possible that the shape of the first heat dissipation pipeline 221 or/and the second heat dissipation pipeline 222 is a hollow polygonal prism, and the hollow structure is any columnar structure; correspondingly, the cross-sectional shape of the first heat dissipation pipeline 221 or/and the second heat dissipation channel 222 is a hollow structure with arbitrary geometric figures, and the periphery is a corresponding polygonal ring.

In one embodiment, as shown in FIGS. 2 and 5, the adjacent first heat dissipation pipelines 221 are arranged in contact, and the adjacent second heat dissipation pipelines 222 are arranged in contact, so that the display modules of the same area can be provided with more heat dissipation channels and more circulation space for the heat dissipation medium, and more heat dissipation medium will circulate on the substrate side of the display panel, which is more conducive to the heat dissipation of the display panel. It may also be that the adjacent first heat dissipation pipelines 221 and/or the adjacent second heat dissipation pipelines 222 are arranged at intervals, that is, the adjacent first heat dissipation pipelines 221 are not in contact, and/or the adjacent second heat dissipation pipelines 222 are not in contact.

Further, the cross-sectional shape of the first heat dissipation pipeline 221 is the same as the cross-sectional shape of the second heat dissipation pipeline 222, and the cross-sectional size of the first heat dissipation pipeline 221 is also the same as the cross-sectional size of the second heat dissipation pipeline 222. In this way, the first heat dissipation pipelines 221 and the second heat dissipation pipelines 222 with the same shape and size are interlaced, the surface formed of the heat dissipation layer 200 will be flatter, and the internal structure will be more uniform and stable.

The outer diameters D of the first heat dissipation pipelines 221 and the second heat dissipation pipelines 222 are less than or equal to 2 cm, and the thicknesses H of the first heat dissipation pipeline 221 and the second heat dissipation pipeline 222 are less than 1 cm.

One embodiment provides a heat dissipation layer. The heat dissipation layer is composed of a plurality of first heat dissipation pipelines 221 extending in a first direction a and a plurality of second heat dissipation pipelines 222 extending in a second direction b arranged in a network-shape. The network-shaped heat dissipation layer provides heat dissipation channels in the first direction a and the second direction b for the display panel, and provides sufficient circulation space for the heat dissipation medium, so that a large amount of heat dissipation medium circulates on the substrate side of the display panel, which is conducive to heat dissipation of the display panel, reduces the temperature of the display panel, facilitates the normal operation and use of the display panel, and alleviates the problem of heat concentration in the current vehicle-mounted display device; at the same time, the network-shaped heat dissipation layer is more stable from a structural point of view, and has better physical properties such as compression and bending resistance, which is beneficial to improve the stability of the display device.

Figure 3:
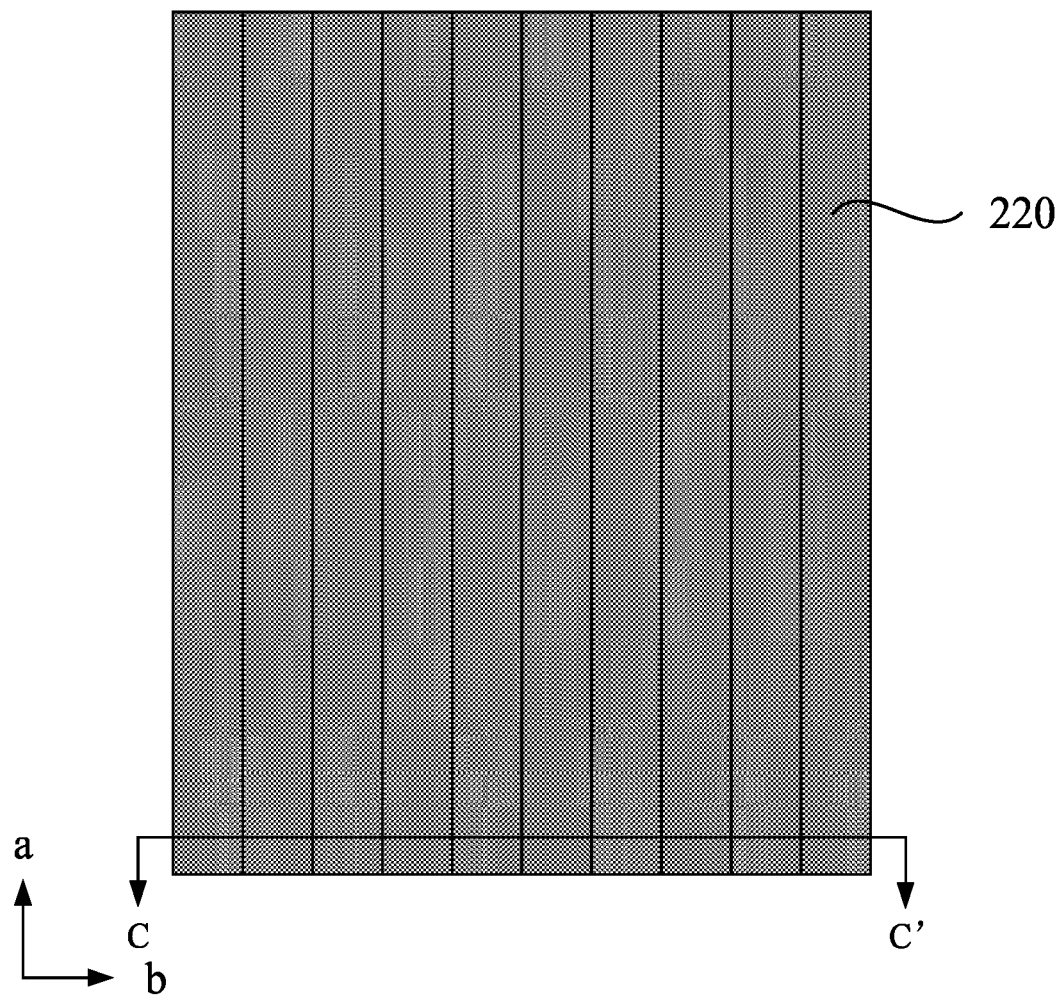
FIG. 3 is a schematic diagram of a second structure of the heat dissipation layer provided by one embodiment of the present disclosure.

In the second embodiment, please refer to FIG. 3, which shows a schematic diagram of a second structure of the heat dissipation layer provided by one embodiment of the present disclosure. As shown in the figure, the heat dissipation layer 200 includes a plurality of heat dissipation pipelines 220 that are extended along a first direction a and arranged along a second direction b. The first direction a and the second direction b are perpendicular to each other. Each of the heat dissipation pipelines 220 includes a hollow structure passing through the heat dissipation pipeline 220 in the first direction a, and the hollow structure forms a heat dissipation channel 210.

FIG. 4 and FIG. 5 are also specifically cross-sectional views along the direction of CC' in FIG. 3, and the same parts in this embodiment and the first embodiment will not be described again, and may refer to the first embodiment.

One embodiment provides a heat dissipation layer composed of a plurality of heat dissipation pipelines 220 extended along a first direction a and arranged along a second direction b. The plurality of heat dissipation pipelines 220 provides a heat dissipation channel in the first direction a for the display panel, and provides sufficient circulation space for the heat dissipation medium, so that a large amount of heat dissipation medium circulates on the substrate side of the display panel, which is beneficial to the heat dissipation of the display panel, reduces the temperature of the display panel, and is beneficial to the normal operation and use of the display panel, and alleviates the problem of heat concentration in the current vehicle-mounted display device.

In the third embodiment, please refer to FIGS. 6 to 9. FIGS. 6 to 9 respectively show fourth to eighth structures of the heat dissipation layer provided by embodiments of the present disclosure. As shown in the figure, the heat dissipation layer 200 includes a first heat dissipation plate 201, a second heat dissipation plate 202, and a plurality of spacer plates 203. The first heat dissipation plate 201 and the second heat dissipation plate 202 are arranged opposite to each other in parallel, and the plurality of spacer plates 203 are arranged between the first heat dissipation plate 201 and the second heat dissipation plate 202, and are connected to the first heat dissipation plate 201 and the second heat dissipation plate 202, respectively. At least two central axes of the spacer plates 203 are parallel to each other and parallel to the first heat dissipation plate 201 and the second heat dissipation plate 202.

The first heat dissipation plate 201, the second heat dissipation plate 202, and at least one of the spacer plates 203 are integrally formed.

In a first embodiment, at least one of the spacer plates 203 is vertically connected to the first heat dissipation plate 201 and the second heat dissipation plate 202, and the first heat dissipation plate 201, the second heat dissipation plate 202, and the adjacent two of the spacer plates 203 jointly enclose the heat dissipation channel 210.

Figure 6:
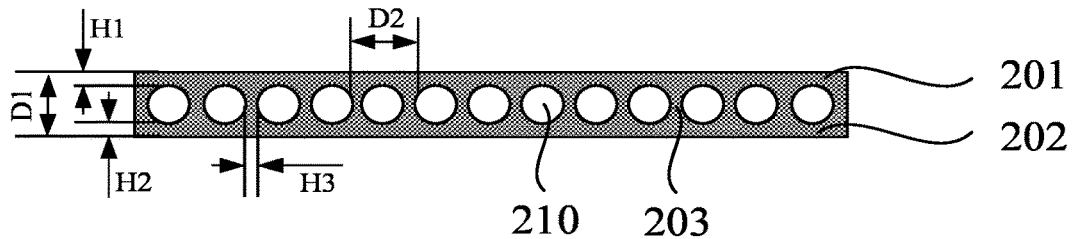
FIG. 6 is a schematic diagram of a fifth structure of the heat dissipation layer provided by one embodiment of the present disclosure.

Please refer to FIG. 6, which shows a schematic diagram of a fifth structure of the heat dissipation layer provided by one embodiment of the present disclosure. As shown in the figure, a shape of the heat dissipation channel 210 is cylindrical, and a cross section of the heat dissipation channel 210 perpendicular to the extending direction of the heat dissipation channel 210 is circular. Further, the dimensions of all the heat dissipation channels 210 are the same.

Figure 7:
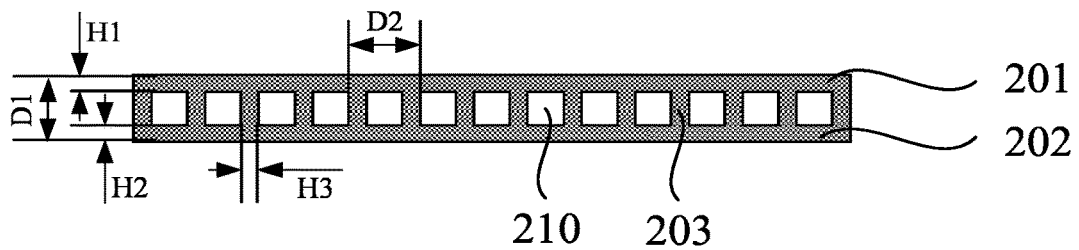
FIG. 7 is a schematic diagram of a sixth structure of the heat dissipation layer provided by one embodiment of the present disclosure.

Please refer to FIG. 7, FIG. 7 shows a schematic diagram of a sixth structure of the heat dissipation layer provided by one embodiment of the present disclosure. As shown in the figure, a shape of the heat dissipation channel 210 is a quadrangular prism, and a cross section of the heat dissipation channel 210 perpendicular to the extending direction of the heat dissipation channel 210 is rectangular. Further, in a direction perpendicular to the first heat dissipation plate 201 and the second heat dissipation plate 202, the plurality of spacer plates 203 are arranged at equal intervals, and the dimensions of all the heat dissipation channels 210 are the same. In a direction perpendicular to the first heat dissipation plate 201 and the second heat dissipation plate 202, the plurality of spacer plates 203 may also be arranged at unequal intervals, that is, in the distance between any two adjacent spacer plates 203, there are at least two having different distance between each other.

In the second embodiment, at least one spacer plate 203 is arranged at an acute angle with the first heat dissipation plate 201 and the second heat dissipation plate 202.

Figure 8:
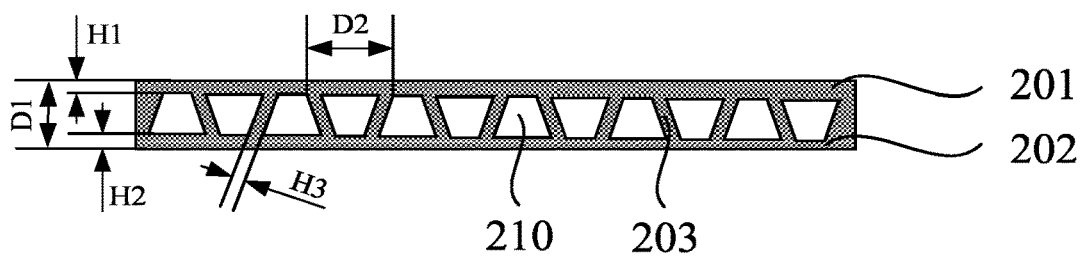
FIG. 8 is a schematic diagram of a seventh structure of the heat dissipation layer provided by one embodiment of the present disclosure.

Please refer to FIG. 8. FIG. 8 shows a schematic diagram of a seventh structure of the heat dissipation layer provided by one embodiment of the present disclosure. As shown in the figure, the first heat dissipation plate 201 or the second heat dissipation plate 202 and the two adjacent spacer plates 203 jointly enclose the heat dissipation channel 210, and a shape of the heat dissipation channel is a triangular prism, a cross section of the heat dissipation channel 210 perpendicular to the extending direction of the heat dissipation channel 210 is a triangular. Further, the dimensions of the all heat dissipation channels 210 are the same.

Figure 9:
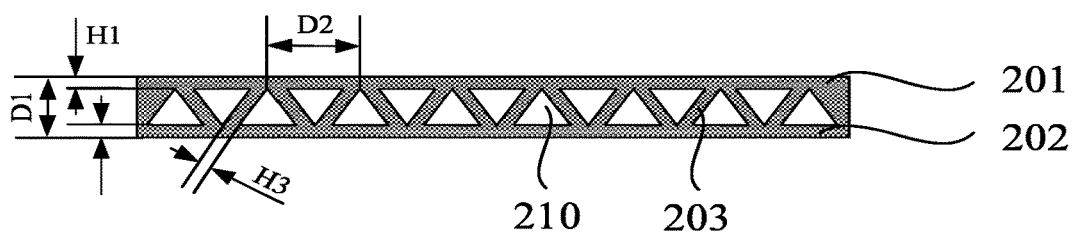
FIG. 9 is a schematic diagram of an eighth structure of the heat dissipation layer provided by one embodiment of the present disclosure.

Please refer to FIG. 9, FIG. 9 shows a schematic diagram of an eighth structure of the heat dissipation layer provided by one embodiment of the present disclosure. As shown in the figure, the first heat dissipation plate 201, the second heat dissipation plate 202, and two adjacent spacer plates 203 jointly enclose the heat dissipation channel 210, a shape of the heat dissipation channel 210 is a quadrangular prism, and a cross section of the heat dissipation channel 210 perpendicular to the extending direction of the heat dissipation channel 210 is a trapezoid.

In one embodiment, the thickness H1 of the first heat dissipation plate 201, the thickness H2 of the second heat dissipation plate 202, and the thickness H3 of the spacer plate 203 are all less than 1 cm. A farthest distance D1 between the first heat dissipation 201 and the second heat dissipation plate 202, and a farthest distance D2 between two adjacent spacer plates 203 are both less than or equal to 2 cm.

One embodiment provides a heat dissipation layer. The heat dissipation layer is composed of a first heat dissipation plate 201 and a second heat dissipation plate 202 arranged opposite to each other in parallel, and a plurality of spacer plates 203 are arranged at intervals between the first heat dissipation plate 201 and the second heat dissipation plate 202. The first heat dissipation plate 201 and/or the second heat dissipation plate 202, and two adjacent spacing plates 203 jointly enclose the heat dissipation channel 210. The plurality of heat dissipation channels 210 provide sufficient circulation space for the heat dissipation medium, so that a large amount of heat dissipation medium circulates on the substrate side of the display panel, which is beneficial to the heat dissipation of the display panel, reduces the temperature of the display panel, and is beneficial to the normal operation and use of the display panel, and alleviates the problem of heat concentration in the current vehicle-mounted display device; at the same time, the first heat dissipation plate 201, the second heat dissipation plate 202, and the plurality of spacer plates 203 are integrally formed, which simplifies the process flow.

At the same time, the present disclosure also provides a display device, the display device includes the display module provided by the embodiments of the present disclosure, the display module including: a display panel, including a substrate, a driving circuit layer, and a display function layer; a heat dissipation layer arranged on a side of the substrate away from the driving circuit layer and configured to dissipate heat of the display panel, a material of the heat dissipation layer includes a thermally conductive metal material; the heat dissipation layer includes a plurality of heat dissipation channels regularly arranged, and each of the heat dissipation channels is configured to allow a heat dissipation medium to pass; and a cooling machine including a heat dissipation medium inlet and a heat dissipation medium outlet, the heat dissipation medium outlet is connected to an inlet end of the heat dissipation channel, and the heat dissipation medium inlet is connected to an outlet end of the heat dissipation channel; the cooling machine is configured to cool the heat dissipation medium transferred from the outlet end of the heat dissipation channel, and input the heat dissipation medium after the cooling process to the plurality of heat dissipation channels.

One embodiment provides a display device, the display device includes the display module provided in the embodiments of the present disclosure, and a cooling machine connected to the heat dissipation layer in the display module. The heat dissipation channel in the heat dissipation layer provides a circulation channel to allow a heat dissipation medium to pass. The heat dissipation medium circulating in the heat dissipation layer is circulated and cooled by the cooling machine, allowing the heat dissipation medium to circulate on the substrate side of the display panel to perform heat dissipation treatment to the display panel, thereby removing the heat of the display panel, and reducing the temperature of the display panel. It is conducive to the normal operation and use of the display panel, and alleviates the problem of heat concentration in the current vehicle-mounted display device In one embodiment, the heat dissipation medium is a gas heat dissipation medium, such as nitrogen, freon, and the like.

In another embodiment, the heat dissipation medium is a liquid heat dissipation medium, such as water.

Since the display device provided in the embodiment of the present disclosure includes the display module provided in the embodiment of the present disclosure, it has the beneficial effects of the display module provided in the embodiment of the present disclosure. For specific operation principles and implementation methods, please refer to the foregoing embodiments, it will not be repeated here.

According to the above embodiment, it can be seen that:

The embodiments of the present disclosure provide a display module and a display device. The display module includes a display panel, including a substrate, a driving circuit layer, and a display function layer; a heat dissipation layer arranged on a side of the substrate away from the driving circuit layer and configured to dissipate heat of the display panel; the heat dissipation layer includes a plurality of heat dissipation channels, and each of the heat dissipation channels is configured to allow a heat dissipation medium to pass. The heat dissipation channel in the heat dissipation layer provides a circulation channel for the heat dissipation medium, allowing the heat dissipation medium to circulate on the substrate side of the display panel to perform heat dissipation treatment to the display panel, thereby removing the heat of the display panel, and reducing the temperature of the display panel. It is conducive to the normal operation and use of the display panel, and alleviates the problem of heat concentration in the current vehicle-mounted display device.

In summary, although the present disclosure has been disclosed as above in preferred embodiments, the above-mentioned preferred embodiments are not intended to limit the present disclosure, and those of ordinary skill in the art can make various changes and modifications without departing from the spirit and scope of the present disclosure. The protection scope of the present disclosure is subject to the scope defined by the claims.

What is claimed is:

1. A display module, comprising:
   a display panel comprising a substrate, a driving circuit layer, and a display function layer;
   a heat dissipation layer arranged on a side of the substrate away from the driving circuit layer and configured to dissipate heat of the display panel, wherein a material of the heat dissipation layer comprises a thermally conductive metal material, the heat dissipation layer comprises a plurality of heat dissipation channels, and each of the heat dissipation channels is configured to allow a heat dissipation medium to pass;
   wherein the heat dissipation layer comprises a plurality of heat dissipation pipelines, the heat dissipation pipelines comprise a plurality of first heat dissipation pipelines and a plurality of second heat dissipation pipelines, and the first heat dissipation pipelines and the second heat dissipation pipelines are interlaced.

2. The display module as claimed in claim 1, wherein each of the heat dissipation pipelines comprises a hollow structure passing through both ends of the heat dissipation pipeline, and the hollow structure forms each of the heat dissipation channels.

3. The display module as claimed in claim 2, wherein the plurality of the first heat dissipation pipelines extend in a first direction, the plurality of the second heat dissipation pipelines extend in a second direction, and the first direction and the second direction are perpendicular to each other.

4. The display module as claimed in claim 2, wherein the plurality of the heat dissipation pipelines extend along a first direction and are arranged in a row along a second direction, and the first direction and the second direction are perpendicular to each other.

5. The display module as claimed in claim 2, wherein an outer diameter of the heat dissipation pipelines is less than or equal to 2 cm, and a thickness of the heat dissipation pipelines is less than 1 cm.

6. A display device, comprising:
a display module comprising a display panel comprising a substrate, a driving circuit layer, and a display function layer;
a heat dissipation layer arranged on a side of the substrate away from the driving circuit layer and configured to dissipate heat of the display panel, wherein a material of the heat dissipation layer comprises a thermally conductive metal material, the heat dissipation layer comprises a plurality of heat dissipation channels, and each of the heat dissipation channels is configured to allow a heat dissipation medium to pass; and
a cooling machine comprising a heat dissipation medium inlet and a heat dissipation medium outlet, wherein the heat dissipation medium outlet is connected to an inlet end of the heat dissipation channel, and the heat dissipation medium inlet is connected to an outlet end of the heat dissipation channel, the cooling machine is configured to cool the heat dissipation medium transferred from the outlet end of the heat dissipation channel, and input the heat dissipation medium after a cooling process to the plurality of heat dissipation channels.

7. The display device as claimed in claim 6, wherein the heat dissipation medium comprises a gas heat dissipation medium or a liquid heat dissipation medium.

8. The display device as claimed in claim 6, wherein the heat dissipation layer comprises a plurality of heat dissipation pipelines, each of the heat dissipation pipelines comprises the hollow structure passing through both ends of the heat dissipation pipeline, and the hollow structure forms each of the heat dissipation channels.

9. The display device as claimed in claim 8, wherein the plurality of heat dissipation pipelines comprise the plurality of first heat dissipation pipelines extending in the first direction and the plurality of second heat dissipation pipelines extending in the second direction, the first direction and the second direction are perpendicular to each other, and the plurality of first heat dissipation pipelines and the plurality of second heat dissipation pipelines are interlaced.

10. The display device as claimed in claim 8, wherein the plurality of heat dissipation pipelines extend along the first direction and are arranged in a row along the second direction, and the first direction and the second direction are perpendicular to each other.

11. The display device as claimed in claim 7, wherein the heat dissipation layer comprises a first heat dissipation plate, a second heat dissipation plate, and a plurality of spacer plates, the first heat dissipation plate and the second heat dissipation plate are arranged opposite to each other in parallel, the plurality of spacer plates are arranged between the first heat dissipation plate and the second heat dissipation plate, and are connected to the first heat dissipation plate and the second heat dissipation plate respectively, the at least two central axes of the spacer plates are parallel to each other and parallel to the first heat dissipation plate, and the first heat dissipation plate and/or the second heat dissipation plate and the adjacent two of the spacer plates jointly enclose the heat dissipation channel.

12. The display device as claimed in claim 11, wherein at least one of the spacer plates is vertically connected to the first heat dissipation plate and the second heat dissipation plate.

13. The display device as claimed in claim 11, wherein at least one of the spacer plates is arranged at an acute angle with the first heat dissipation plate and the second heat dissipation plate.

14. The display device as claimed in claim 8, wherein the outer diameter of the heat dissipation channel is less than or equal to 2 cm, and the thickness of the heat dissipation channel is less than 1 cm.

15. The display device as claimed in claim 11, wherein the thicknesses of the first heat dissipation plate, the second heat dissipation plate, and the spacer plates are all less than 1 cm, and the thickness of the heat dissipation layer is less than or equal to 2 cm.

\* \* \* \* \*